(12) United States Patent
Karlsson

(10) Patent No.: US 6,992,525 B2
(45) Date of Patent: Jan. 31, 2006

(54) ARRANGEMENT IN A PULSE AMPLIFIER

(75) Inventor: Lars Karlsson, Väsby (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/013,245

(22) Filed: Dec. 15, 2004

(65) Prior Publication Data
US 2005/0093586 A1    May 5, 2005

Related U.S. Application Data

(63) Continuation of application No. PCT/SE03/00820, filed on May 21, 2003.

(30) Foreign Application Priority Data
Jun. 17, 2002   (SE)   ..................... 0201859

(51) Int. Cl.
*G06G 7/12*   (2006.01)
(52) U.S. Cl. ................ 327/562; 327/112; 330/251
(58) Field of Classification Search ............... 327/562, 327/112; 330/251
See application file for complete search history.

(56) References Cited

U.S. PATENT DOCUMENTS

| | | | | |
|---|---|---|---|---|
| 6,236,273 | B1 | 5/2001 | Lewyn | 330/297 |
| 6,292,037 | B1 * | 9/2001 | Itoh | 327/112 |
| 6,859,096 | B2 * | 2/2005 | Tanaka et al. | 330/251 |
| 6,917,236 | B2 * | 7/2005 | Doutreloigne et al. | 327/333 |
| 2004/0021512 | A1 * | 2/2004 | Tanaka et al. | 330/251 |

FOREIGN PATENT DOCUMENTS

DE      100 56 454 A1    5/2002

* cited by examiner

*Primary Examiner*—Long Nguyen
(74) *Attorney, Agent, or Firm*—Baker Botts L.L.P.

(57) ABSTRACT

A pulse amplifier implemented in standard CMOS, comprises a control circuit for controlling a driver stage for driving a class D output stage that comprises a first PMOS-transistor and a first NMOS-transistor with interconnected drain contacts. A driver stage comprises a first driver and a second driver coupled with the output stage. Furthermore, a second NMOS transistor and second to fifth PMOS transistors are provided and interconnected in a way that most of the control signals needed to switch the high voltage output, specifically the drivers, are generated within a low voltage block. These factors contribute to lowering the total power dissipation.

16 Claims, 2 Drawing Sheets

ARRANGEMENT IN A PULSE AMPLIFIER

CROSS-REFERENCE TO RELATED APPLICATION

This application is a continuation of copending International Application No. PCT/SE03/00820 filed May 21, 2003 which designates the United States, and claims priority to Swedish application no. 0201859-6 filed Jun. 17, 2002.

TECHNICAL FIELD OF THE INVENTION

The invention relates generally to pulse amplifiers and more specifically to an arrangement for reducing power consumption in such amplifiers.

BACKGROUND OF THE INVENTION

In an ADSL (Asymmetric Digital Subscriber Line) modem, power consumption is a very important factor, especially on the Central Office (CO) side. If the power consumption can be lowered, the number of lines per line card can be increased without additional cooling. One of the large power consumers in an ADSL modem is the Line Driver (LD). The power efficiency of standard ADSL line drivers is quite low.

In an attempt to increase the power efficiency of line drivers, new methods of designing the line drivers have been investigated.

One of these methods involves using a class D amplifier. The output stage of the class D amplifier drives the modulated input signal onto the line through a low pass LC filter which demodulates the signal into a continuous ADSL signal.

Today, various techniques are used to implement class D amplifiers, but most use the same inverter-type of switching output stage. However, it is expensive to manufacture high-voltage components such as those needed to obtain the voltage levels required by ADSL. Thus, it would be advantageous if low-voltage components could be used instead. Also, solutions to date for class D implementations are designed for audio band frequencies (up to 4 kHz). DSL applications use much higher frequencies (several MHz). This places tougher requirements on speed in the class D implementation.

In ADSL, the maximum voltage amplitude needed on the line is 30 V peak-to-peak at the CO side with a PAR (Peak to Average Ratio) of 4.5. If a transformer is used, the voltage requirements on the output stage can be reduced. However, the output stage should still be able to handle relatively high voltages. The transformer turn ratio should be kept as low as possible since a high transformer turn ratio will increase the required output current and degrade the receive path. Higher currents lead to larger output transistors and hence larger power consumption in the drivers.

In a manner known per se, the class D output stage comprises an NMOS transistor and a PMOS transistor that must not be on at the same time. If both transistors were on at the same time, a high current would be obtained through the transistors. This high current would destroy the output stage or for shorter duration lead to power loss.

In order to ensure that the NMOS and PMOS transistors are not on at the same time, a time delay is introduced between the turn-off time of the NMOS transistor and the turn-on time of the PMOS transistor and vice versa. This so-called deadtime should be as short as possible since it leads to distortion.

The resistance of the output transistors when on should be as low as possible in order to reduce the power loss.

Since the ADSL line driver market is very competitive, small die sizes and relatively inexpensive manufacturing processes are important.

SUMMARY OF THE INVENTION

The object of the invention is to bring about an output stage driver implemented in a standard CMOS process, that is able to switch a high output voltage with a very short deadtime and that has a low total power consumption.

This is attained by the arrangement according to the invention in a pulse amplifier, implemented in standard CMOS, that comprises a control circuit for controlling a driver stage for driving a class D output stage that comprises a first PMOS transistor and a first NMOS transistor with interconnected drain contacts, the interconnection point constituting an output terminal of the pulse amplifier. The first PMOS transistor is connected with its source and bulk contacts to a first supply voltage terminal for a first supply voltage, and the first NMOS transistor is connected with its source contact to a second supply voltage terminal for a second, lower supply voltage. The driver stage comprises a first driver that is connected with its input terminal to a first output terminal of the control circuit and with its output terminal to a gate contact of the first NMOS transistor, and a second driver that is connected with its input terminal to a second output terminal of the control circuit and with its output terminal to a gate contact of a second NMOS transistor. The second NMOS transistor is connected with its source contact to said second supply voltage terminal and with its drain contact to a drain contact of a second PMOS transistor. The second PMOS transistor is connected with its source and bulk contacts to the interconnection point between a gate contact of the first PMOS transistor and a drain contact of a third PMOS transistor and to a drain contact of a fourth PMOS transistor and with its gate contact to a voltage node. The third PMOS transistor is connected with its bulk contact to said first supply voltage terminal, with its source contact to an interconnection point between a gate contact of the fourth PMOS transistor and a drain contact of a fifth PMOS transistor and with its gate contact to a first control voltage node. The fourth and fifth PMOS transistors are connected with their source and bulk contacts to said first supply voltage terminal, and the fifth PMOS transistor is connected with its gate contact to a second control voltage node.

BRIEF DESCRIPTION OF THE DRAWING

The invention will be described more in detail below with reference to the appended drawing on which

DESCRIPTION OF THE INVENTION

Figure 1:
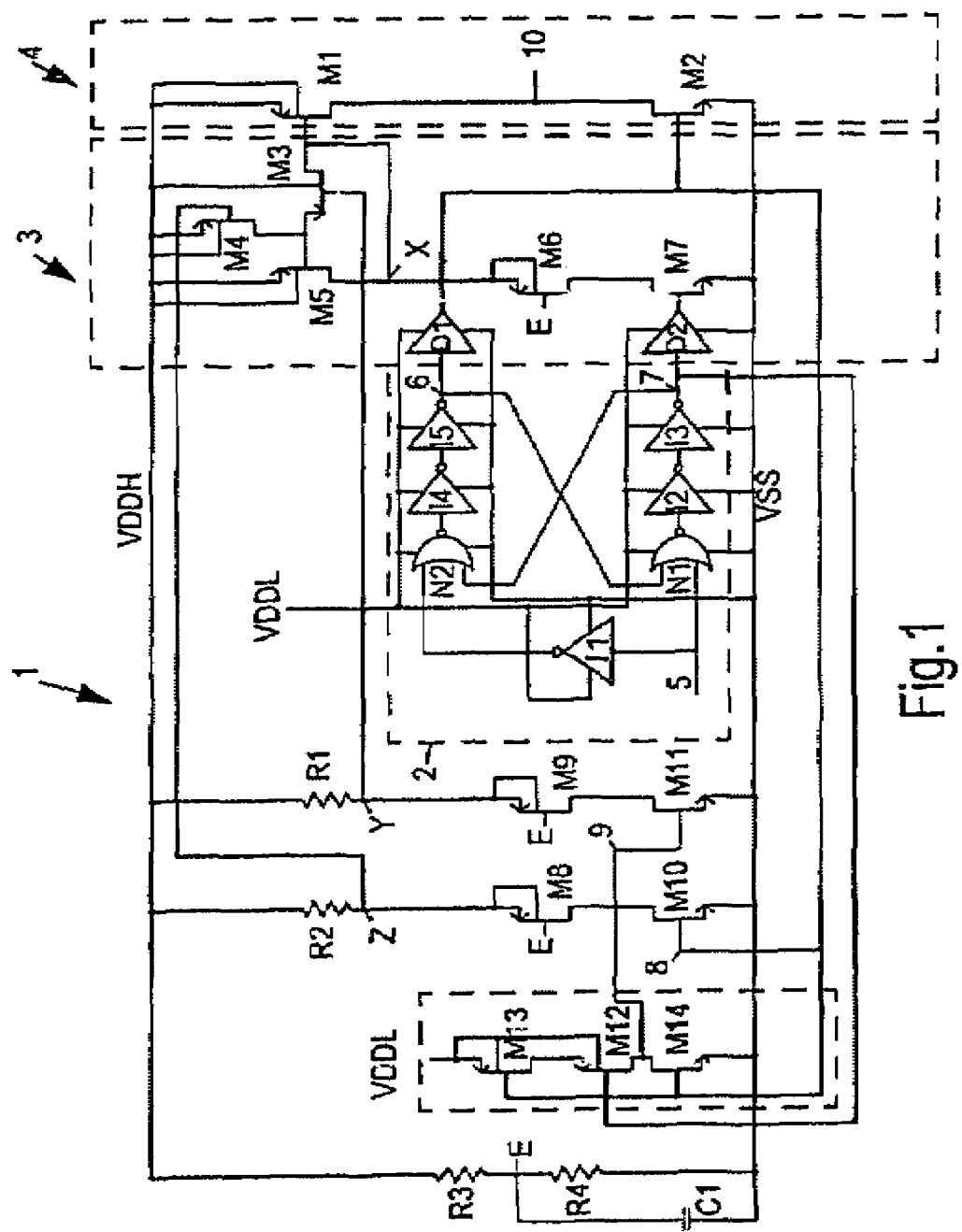
FIG. 1 is a circuit diagram of an embodiment of an arrangement according to the invention in a pulse amplifier.

FIG. 1 is a circuit diagram of an embodiment of an arrangement according to the invention in a pulse amplifier 1.

The pulse amplifier 1 comprises a control circuit 2, a driver stage 3 that is connected to the control circuit 2, and a class D output stage 4 that is connected to the driver stage 3. The pulse amplifier 1, the control circuit 2, the driver stage 3, and the class D output stage 4 are all implemented in standard CMOS.

In a manner known per se, the output stage 4 comprises a PMOS transistor M1 and an NMOS transistor M2 with interconnected drain contacts. The interconnection point between the drain contacts of the transistors M1, M2 constitutes an output terminal 10 of the pulse amplifier 1.

Also in a manner known per se, the PMOS transistor M1 is connected with its source and bulk contacts to a supply voltage terminal VDDH and the NMOS transistor M2 is connected with its source contact to a supply voltage terminal VSS. The voltage supplied via the terminal VSS is lower than the voltage supplied via the terminal VDDH.

The control circuit 2 has one input terminal 5 and two output terminals 6, 7. The input terminal 5 is connected to the input terminal of an inverter I1 and to one input terminal of a NOR gate N1 whose other input terminal is connected to the output terminal 6 of the control circuit 2. The output terminal of the inverter I1 is connected to one input terminal of a NOR gate N2 whose other input terminal is connected to the output terminal 7 of the control circuit 2. The output terminal of the NOR gate N1 is connected to the output terminal 7 of the control circuit 2 via two series-connected inverters I2, I3. The output terminal of the NOR gate N2 is connected to the output terminal 6 of the control circuit 2 via two series-connected inverters I4, I5.

The inverters I1–I5 and the NOR gates N1, N2 are all connected with their supply voltage terminals to a supply voltage terminal VDDL and the supply voltage terminal VSS.

The supply voltage terminal VDDL is to be at a lower potential than the supply voltage terminal VDDH. Hereby, the overall power dissipation is reduced.

In accordance with the invention, the driver stage comprises two drivers D1, D2. The driver D1 is connected with its input terminal to the output terminal 6 of the control circuit 2 and with its output terminal to the gate contact of the NMOS transistor M2. The driver D2 is connected with its input terminal to the output terminal 7 of the control circuit 2 and with its output terminal to the gate contact of an NMOS transistor M7.

In accordance with the invention, the drivers D1, D2 are connected with their supply voltage terminals to the supply voltage terminal VDDL and the supply voltage terminal VSS.

The NMOS transistor M7 is connected with its source contact to the supply voltage terminal VSS and with its drain contact to the drain contact of a PMOS transistor M6.

The PMOS transistor M6 is connected with its source and bulk contacts to a voltage node X and with its gate contact to a voltage node E.

In the embodiment in FIG. 1, the voltage node X is connected to an interconnection point between the gate contact of the PMOS transistor M1 and the drain contact of a PMOS transistor M3, and to the drain contact of a PMOS transistor M5.

The voltage node E is an interconnection point between one terminal of a resistor R3 and one terminal of a parallel-connection of a resistor R4 and a capacitor C1. The other terminal of the resistor R3 is connected to the supply voltage terminal VDDH and the other terminal of the parallel-connection of the resistor R4 and the capacitor C1 is connected to the supply voltage terminal VSS.

The PMOS transistor M3 is connected with its bulk contact to the supply voltage terminal VDDH, with its source contact to an interconnection point between the gate contact of the PMOS transistor M5 and the drain contact of a PMOS transistor M4 and with its gate contact to a control voltage node Y.

In the embodiment in FIG. 1, the control voltage node Y is an interconnection point between one terminal of a resistance element R1 and interconnected source and bulk contacts of a PMOS transistor M9. The other terminal of the resistance element R1 is connected to the supply voltage terminal VDDH. The PMOS transistor M9 is connected with its gate contact to the voltage node E and with its drain contact to the drain contact of an NMOS transistor M11. The NMOS transistor M11 is connected with its source contact to the supply voltage terminal VSS and with its gate contact to a control voltage node 9.

In the embodiment in FIG. 1, the control voltage node 9 is an interconnection point between drain contacts of a PMOS transistor M12 and an NMOS transistor M14. The source contact of the PMOS transistor M12 is interconnected with the drain contact of a PMOS transistor M13. The bulk contact of the PMOS transistor M12 is interconnected with the bulk and source contacts of the PMOS transistor M13 to the supply voltage terminal VDDL. The gate contact of the PMOS transistor M12 is connected to the output terminal 7 of the control circuit 2. The source contact of the NMOS transistor M14 is connected to the supply voltage terminal VSS, and the gate contacts of the PMOS transistor M13 and the NMOS transistor M14 are connected to the output terminal of the driver D1.

The PMOS transistors M5, M4 are connected with their source and bulk contacts to the supply voltage terminal VDDH, and the PMOS transistor M4 is connected with its gate contact to a control voltage node Z.

In the embodiment in FIG. 1, the control voltage node Z is an interconnection point between one terminal of a resistance element R2 and interconnected source and bulk contacts of a PMOS transistor M8. The other terminal of the resistance element R2 is connected to the supply voltage terminal VDDH. The PMOS transistor M8 is connected with its gate contact to the voltage node E and with its drain contact to the drain contact of an NMOS transistor M10. The NMOS transistor M10 is connected with its source contact to the supply voltage terminal VSS and with its gate contact 8 to the output terminal of the driver D1.

With reference to the pulse diagrams in FIGS. 2a–f, the function of the pulse amplifier in FIG. 1 will now be described.

FIG. 2a illustrates an input pulse signal V5 that is received on the input terminal 5 of the control circuit 2 and is to be amplified.

From the input pulse signal V5, the control circuit 2 generates a control pulse signal V6 illustrated in FIG. 2b on its output terminal 6 and a control pulse signal V7 illustrated in FIG. 2c on its output terminal 7.

The control pulse signal V6 in FIG. 2b is used to control the NMOS transistor M2 and the control pulse signal V7 in FIG. 2c is used to control the PMOS transistor M1.

In order for the NMOS transistor M2 and the PMOS transistor M1 not to be on at the same time, the control pulse signals V6 and V7 are generated by the control circuit 2 such that the pulses do not overlap, i.e. are not high at the same time, as apparent from FIGS. 2b and 2c.

Figure 2:
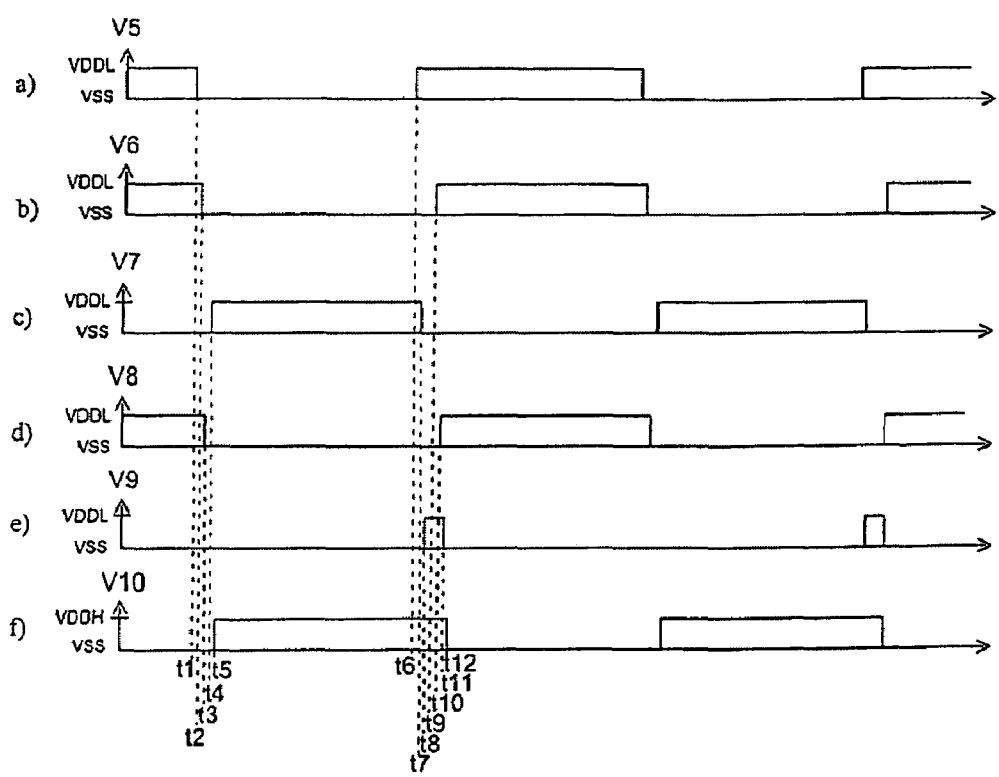
FIGS. 2a–f are pulse diagrams in different nodes in the amplifier in FIG. 1.

With reference to the pulse diagram in FIG. 2, an embodiment of one period t1–t12 of the amplifier in FIG. 1 will be described.

At time t1, the input signal V5 at node 5 switches from VDDL down to VSS.

At time t2, after a delay due to the logic gates N2, I4 and I5, the control pulse signal V6 at node 6 is forced down to VSS.

At time t4, after a delay due to the delay above and the logic gates N1, I2 and I3, the control pulse signal V7 at node 7 is forced up to VDDL.

Hence, two non-overlapping control pulse signals V6, V7 are generated that first switch the transistor M2 off and then turn the transistor M1 on. The transistor M2 is switched off directly by the driver D1 and the transistor M1 is switched on through the driver D2 and the transistors M7 and M6.

At time t5, the output signal V10 at node 10 is pulled up to VDDH.

When the transistor M7 is switched on by the driver D2 node X will be pulled down towards VSS. However, the transistor M6 will limit the current when node X approaches the potential of voltage node E, thus insuring that the gate-bulk voltage of the transistor M1 is not exceeded.

At time t3, the output signal of the driver D1 pulls the voltage V8 at the gate contact node 8 of the transistor M10 down from VDDL to VSS and switches off the transistor M4 since resistor R2 pulls node Z up to VDDH. The transistor M4 is needed to keep the gate potential of the transistor M5 at VDDH when the gate of the transistor M1 is pulled down to VSS.

Hence, the output signal V10 at node 10 has been switched to VDDH from VSS by the input signal V5 at node 5 traversing from VDDL to VSS.

Likewise, when the input signal at node 5 switches from VSS up to VDDL at time t6, the two non-overlapping control signals V6, V7 are generated in the same manner as above except that now, the signal V7 at node 7 is switched down to VSS at time t7 before the signal V6 at node 6 is switched up to VDDL at time t9.

When node 7 is switched down to VSS, the transistor M12 is turned on and since the potential in node 8 still is at VSS, the transistor M3 is turned on through transistors M11 and M9 since node 9 is pulled up to VDDL at time t8 by transistors M12 and M13.

As the transistor M3 starts to turn on, the potential at the gate of the transistor M5 will fall down towards the potential at node X thus causing the transistor M5 to turn on. The transistor M5 will be on until is has pulled node X up to VDDH and turned M1 off.

At time t10, the transistors M2 and M10 are switched on directly by driver D1 and the output voltage V10 at node 10 is pulled down to VSS at time t12. Driver D1 also turns on transistor M4.

At time t11, the control voltage V9 at node 9 is pulled down to VSS through the transistor M14.

Hence, the transistor M3 is turned off since node Y is pulled up to VDDH by the resistor R1 when the transistor M11 is turned off.

Hence, the output signal V10 at node 10 has been switched back to VSS from VDDH by the input signal V5 on node 5 traversing from VSS to VDDL.

In this manner, a high output voltage VDDH at node 10 can be switched by a low voltage (VDDL) input signal V5.

Also, most of the control signals needed to switch the high voltage output, specifically the drivers, are generated within the low voltage block.

These factors contribute to lowering the total power dissipation.

The arrangement according to the invention can also be used in a so-called differential mode with two output terminals and two amplifier stages. In such an application, the same control circuit 2 as well as R3, R4 and C4 can be used for both amplifier stages. However, nodes 6 and 7 have to be interchanged so that node 6 is connected to M7 of the second stage via a driver in that second stage and node 7 is connected to M2 of the second stage also via a driver in that second stage. Thus, the second stage output will switch opposite to the first stage, i.e. when the first stage switches up to VDDH, the second stage switches down to VSS.

I claim:

1. An arrangement in a pulse amplifier implemented in standard CMOS, comprising a control circuit for controlling a driver stage for driving a class D output stage that comprises a first PMOS transistor and a first NMOS transistor with interconnected drain contacts constituting an output terminal of the pulse amplifier, the first PMOS transistor being connected with its source and bulk contacts to a first supply voltage terminal for receiving a first supply voltage, and the first NMOS transistor being connected with its source contact to a second supply voltage terminal for receiving a second supply voltage that is lower than the first supply voltage, wherein the driver stage comprises a first driver that is connected with its input terminal to a first output terminal of the control circuit and with its output terminal to a gate contact of the first NMOS transistor, and a second driver that is connected with its input terminal to a second output terminal of the control circuit and with its output terminal to a gate contact of a second NMOS transistor, the second NMOS transistor is connected with its source contact to said second supply voltage terminal and with its drain contact to a drain contact of a second PMOS transistor, the second PMOS transistor is connected with its source and bulk contacts to an interconnection point between a gate contact of the first PMOS transistor and a drain contact of a third PMOS transistor and to a drain contact of a fourth PMOS transistor and with its gate contact to a voltage node, the third PMOS transistor is connected with its bulk contact to said first supply voltage terminal, with its source contact to an interconnection point between a gate contact of the fourth PMOS transistor and a drain contact of a fifth PMOS transistor and with its gate contact to a first control voltage node, the fourth and fifth PMOS transistors are connected with their source and bulk contacts to said first supply voltage terminal, and wherein the fifth PMOS transistor is connected with its gate contact to a second control voltage node.

2. The arrangement according to claim 1, wherein said first and second drivers are connected with their supply voltage terminals to a third supply voltage terminal for receiving a third supply voltage.

3. The arrangement according to claim 1, wherein an input terminal of the control circuit is connected to an input terminal of a first inverter and to one input terminal of a first NOR gate whose another input terminal is connected to said first output terminal of the control circuit, an output terminal of the first inverter is connected to one input terminal of a second NOR gate whose another input terminal is connected to said second output terminal of the control circuit, an output terminal of the first NOR gate is connected to said second output terminal of the control circuit via a second inverter in series with a third inverter, and an output terminal of the second NOR gate is connected to said first output terminal of the control circuit via a fourth inverter in series with a fifth inverter.

4. The arrangement according to claim 3, wherein the first to fifth inventors and the first and second NOR gates are connected with their supply voltage terminals to said third supply voltage terminal.

5. The arrangement according to claim 1, wherein said voltage node is an interconnection point between one terminal of a first resistor and one terminal of a parallel-connection of a second resistor and a capacitor, the other terminal of the first resistor being connected to said first supply voltage terminal and the other terminal of said parallel-connection being connected to said second supply voltage terminal.

6. The arrangement according to claim 1, wherein said first control voltage node is an interconnection point between one terminal of a first resistance element and interconnected source and bulk contacts of a sixth PMOS transistor, the other terminal of the first resistance element is connected to said first supply voltage terminal, the sixth PMOS transistor is connected with its gate contact to said voltage node and with its drain contact to a drain contact of a third NMOS transistor, and the third NMOS transistor is connected with its source contact to said second supply voltage terminal and with its gate contact to a third control voltage node.

7. The arrangement according to claim 1, wherein said second control voltage node is an interconnection point between one terminal of a second resistance element and interconnected source and bulk contacts of a seventh PMOS transistor, the other terminal of the second resistance element is connected to said first supply voltage terminal, the seventh PMOS transistor is connected with its gate contact to said voltage node and with its drain contact to a drain contact of a fourth NMOS transistor, and the fourth NMOS transistor is connected with its source contact to said second supply voltage terminal and with its gate contact to the output terminal of the first driver.

8. The arrangement according to claim 6, wherein said third control voltage node is an interconnection point between drain contacts of an eight PMOS transistor and a fifth NMOS transistor, a source contact of the eight PMOS transistor is interconnected with a drain contact of a ninth PMOS transistor, a bulk contact of the eight PMOS transistor is interconnected with bulk and source contacts of the ninth PMOS transistor to said third supply voltage terminal, a gate contact of the eight PMOS transistor is connected to the second output terminal of the control circuit, a source contact of the fifth NMOS transistor is connected to said second supply voltage terminal, and a gate contact of the ninth PMOS transistor and the fifth NMOS transistor is connected to the output terminal of the first driver.

9. An arrangement in a pulse amplifier implemented in standard CMOS, comprising:
a control circuit;
an output stage comprising a first PMOS transistor and a first NMOS transistor with interconnected drain contacts constituting an output terminal of the pulse amplifier, the first PMOS transistor being connected with its source and bulk contacts to a first supply voltage terminal for receiving a first supply voltage, and the first NMOS transistor being connected with its source contact to a second supply voltage terminal for receiving a second supply voltage that is lower than the first supply voltage, a second NMOS transistor connected with its source contact to said second supply voltage terminal and with its drain contact to a drain contact of a second PMOS transistor connected with its source and bulk contacts to an interconnection point between a gate contact of the first PMOS transistor and a drain contact of a third PMOS transistor and to a drain contact of a fourth PMOS transistor and with its gate contact to a voltage node, wherein the third PMOS transistor is connected with its bulk contact to said first supply voltage terminal, with its source contact to an interconnection point between a gate contact of the fourth PMOS transistor and a drain contact of a fifth PMOS transistor and with its gate contact to a first control voltage node, wherein the fourth and fifth PMOS transistors are connected with their source and bulk contacts to said first supply voltage terminal, and the fifth PMOS transistor is connected with its gate contact to a second control voltage node; and
a driver stage comprising a first driver that is connected with its input terminal to a first output terminal of the control circuit and with its output terminal to a gate contact of the first NMOS transistor, and a second driver that is connected with its input terminal to a second output terminal of the control circuit and with its output terminal to a gate contact of the second NMOS transistor.

10. The arrangement according to claim 9, wherein said first and second drivers are connected with their supply voltage terminals to a third supply voltage terminal for receiving a third supply voltage.

11. The arrangement according to claim 9, wherein an input terminal of the control circuit is connected to an input terminal of a first inverter and to one input terminal of a first NOR gate whose another input terminal is connected to said first output terminal of the control circuit, an input terminal of the first inverter is connected to one input terminal of a second NOR gate whose another input terminal is connected to said second output terminal of the control circuit, an input terminal of the first NOR gate is connected to said second output terminal of the control circuit via a second inverter in series with a third inverter, and an input terminal of the second NOR gate is connected to said first output terminal of the control circuit via a fourth inverter in series with a fifth inverter.

12. The arrangement according to claim 11, wherein the first to fifth inventors and the first and second NOR gates are connected with their supply voltage terminals to said third supply voltage terminal.

13. The arrangement according to claim 9, wherein said voltage node is an interconnection point between one terminal of a first resistor and one terminal of a parallel-connection of a second resistor and a capacitor, the other terminal of the first resistor being connected to said first supply voltage terminal and the other terminal of said parallel-connection being connected to said second supply voltage terminal.

14. The arrangement according to claim 9, wherein said first control voltage node is an interconnection point between one terminal of a first resistance element and interconnected source and bulk contacts of a sixth PMOS transistor, the other terminal of the first resistance element is connected to said first supply voltage terminal, the sixth PMOS transistor is connected with its gate contact to said voltage node and with its drain contact to a drain contact of a third NMOS transistor, and the third NMOS transistor is connected with its source contact to said second supply voltage terminal and with its gate contact to a third control voltage node.

15. The arrangement according to claim 9, wherein said second control voltage node is an interconnection point between one terminal of a second resistance element and interconnected source and bulk contacts of a seventh PMOS transistor, the other terminal of the second resistance element is connected to said first supply voltage terminal, the seventh PMOS transistor is connected with its gate contact to said voltage node and with its drain contact to a drain contact of a fourth NMOS transistor, and the fourth NMOS transistor is connected with its source contact to said second supply voltage terminal and with its gate contact to the output terminal of the first driver.

16. The arrangement according to claim 14, wherein said third control voltage node is an interconnection point between drain contacts of an eight PMOS transistor and a fifth NMOS transistor, a source contact of the eight PMOS transistor is interconnected with a drain contact of a ninth PMOS transistor, a bulk contact of the eight PMOS transistor is interconnected with bulk and source contacts of the ninth PMOS transistor to said third supply voltage terminal, a gate contact of the eight PMOS transistor is connected to the second output terminal of the control circuit, a source contact of the fifth NMOS transistor is connected to said second supply voltage terminal, and a gate contact of the ninth PMOS transistor and the fifth NMOS transistor is connected to the output terminal of the first driver.

\* \* \* \* \*